United States Patent [19]

LeGoff

[11] 4,205,225
[45] May 27, 1980

[54] METHOD OF GENERATING AN ELECTRIC PULSE OF PREDETERMINED SHAPE AND APPLICATION TO CUTTING OUT A PORTION FROM A LASER PULSE

[75] Inventor: Denis LeGoff, Saint Cyr l'Ecole, France

[73] Assignee: Compagnie Generale d'Electricite, Paris, France

[21] Appl. No.: 935,290

[22] Filed: Aug. 21, 1978

[30] Foreign Application Priority Data

Aug. 25, 1977 [FR] France ................................ 77 25940

[51] Int. Cl.² ............................................. G01D 5/34
[52] U.S. Cl. .................................... 250/229; 332/7.51
[58] Field of Search ................ 250/211 R, 211 J, 229; 331/94.5 M, 94.5 Q; 332/7.51

[56] References Cited

U.S. PATENT DOCUMENTS

| 3,609,389 | 9/1971 | Bjorkholm ..................... 331/94.5 M |
| 3,949,224 | 4/1976 | Klingen .............................. 250/229 |

OTHER PUBLICATIONS

"A Kilovolt Picosecond Optoelectronic Switch and Pockel's Cell" App. Phy. Let. v. 8, No. 1, 1-1976 pp. 21-23 P. Le Fu et al.
"High Speed Optoelectronic Switching in Silicon Gap-Shunt Microstrip Structures" Electronic Letters v. 12, No. 17, 8-1976, pp. 437-438, W. Platte.

*Primary Examiner*—David C. Nelms
*Attorney, Agent, or Firm*—Sughrue, Rothwell, Mion, Zinn and Macpeak

[57] ABSTRACT

An electrical pulse of predetermined waveform is generated to control an electro-optical shutter to cut out a portion of predetermined waveform from a laser pulse passing therethrough. The electrical pulse is generated across the plates of a capacitor. A DC source is connected directly to one of the plates and the other via a conductor and a semiconductor switch.

The waveform is generated by illuminating the semiconductor switch with a series of short rapid light pulses from a mode-locked laser generator. A staircase waveform results with each step corresponding to a pulse from the mode-locked laser. The waveform can be matched to the predetermined model by adjusting the intensity and the spacing of the switching laser pulses.

The falling portion of the waveform can be similarly produced using a second semiconductor switch connected between the capacitor plates together. For a very steep falling edge a single high intensity light pulse can be applied shorting the plates together via the second switch.

8 Claims, 6 Drawing Figures

METHOD OF GENERATING AN ELECTRIC PULSE OF PREDETERMINED SHAPE AND APPLICATION TO CUTTING OUT A PORTION FROM A LASER PULSE

FIELD OF THE INVENTION

The present invention relates to a method of generating an electric pulse of a predetermined shape and to an application of the method to cutting out a portion from a laser pulse.

BACKGROUND OF THE INVENTION

Generators of high-voltage electric pulses which last for only a short period are known. The duration of pulses delivered by some of these generators can be adjusted, but in contrast, it is not possible to modify the voltage waveform of these pulses which depends essentially on the type of generator and on the type of load circuit connected to the output terminals of the generator.

These pulse generators can be applied to cutting out portions of defined duration from laser pulses. For this purpose, the output terminals of an electric pulse generator are connected to the electrodes of an electro-optical shutter disposed on the path of a laser pulse which is to be cut, said laser pulse being delivered by a laser generator. The electric pulse generator is synchronized with the laser generator so that the electric pulse, which lasts for a very much shorter time than the laser pulse, is delivered during the time that the laser pulse is passing through the shutter. The shape of the laser pulse thus cut out depends on the rising and falling wavefronts of the electric pulse and on the waveform of the laser pulse delivered by the laser generator.

In some applications, the cutout portion of the laser pulse is not only required to have a predetermined duration, but also a predetermined waveform; the latter requirement cannot be complied with when using presently known electric pulse generators.

It is possible to use a laser generator which generates very short pulses to generate longer laser pulses which have a predetermined waveform by disposing an optical device on the emission axis of the laser generator said device comprising successively a polarizer, a quarter-wave plate, several semi-transparent mirrors and a reflector. But this method is rather tricky in use, since it requires relatively complicated prior calculations.

The present invention aims to generate very simply an electric pulse of a predetermined shape and thus to cut out a portion of predetermined waveform from a laser pulse.

SUMMARY OF THE INVENTION

The present invention provides a method of generating an electric pulse of predetermined waveform, the method comprising the steps of:

providing a capacitor having first and second plates, the first plate being connected to a conductor by a portion of semiconductor material which is rendered conductive by the application of light thereto, the said conductor and the second plate of the capacitor being connected to respective poles of a DC source;

illuminating the said semiconductor material with a sequence of light pulses of intensity sufficient to enable an electric charge to accumulate on the capacitor at each pulse thereby causing the capacitor to charge following a staircase charging curve;

adjusting the duration of the intervals of time which separate two successive light pulses in accordance with a predetermined program, so that the average of the staircase charging curve of the capacitor has a waveform which approximates the rising portion of the predetermined waveform; a variation in one direction of the duration of an interval of time causing a variation in the opposite direction of the instantaneous gradient of the curve; and after illumination, equalizing the potentials of the plates so as to discharge the capacitor along a curve whose form is substantially identical to that of the falling portion of the predetermined waveform.

The present invention also provides a method of cutting out a portion from a laser pulse, using an electric pulse generated by the method defined in the preceding paragraph, wherein the electro-optical crystal of an electro-optical cell is disposed on the path of the laser pulse from which a portion is to be cut out, and the two electrodes of the electro-optical cell are connected respectively to the two plates of the capacitor, the light pulses being delivered to the capacitor while the laser pulse is passing through the electro-optical cell.

An embodiment of the invention is described hereinbelow by way of example with reference to the accompanying drawings.

DESCRIPTION OF THE PREFERRED EMBODIMENT

Figure 1:
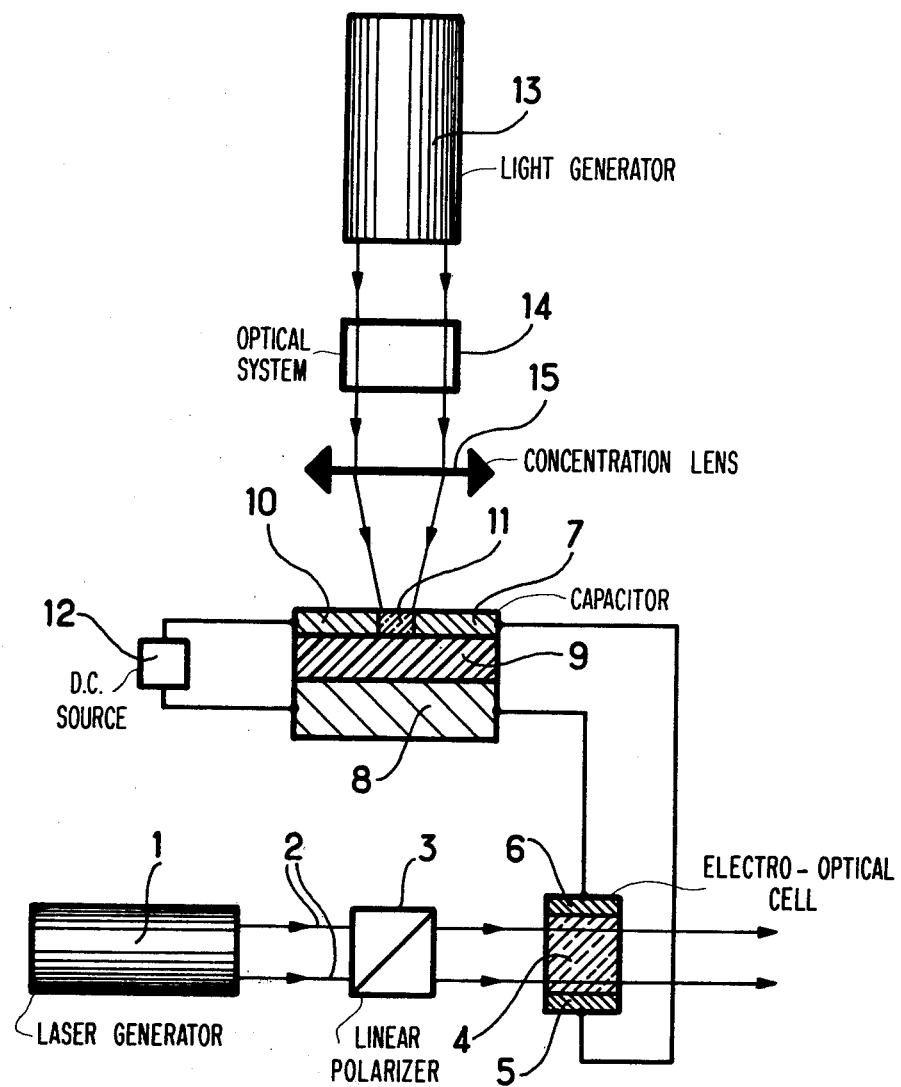
FIG. 1 shows schematically a device which uses the methods in accordance with the invention.

In FIG. 1, a laser generator 1 emits a pulse 2 which lasts 30 nanoseconds. This pulse passes through a linear polarizer 3 to be received on an electro-optical cell formed by a lithium niobate electro-optical crystal 4 provided with two electrodes 5 and 6. These two electrodes are respectively connected to two opposite metal plates 7 and 8 applied against two surfaces of a dielectric plate 9 to form a capacitor. The plate 7 is connected to an electric conductor 10 via a part 11 made of a semiconductive material such as silicon; the part 11 is in contact with the plate 7 and the conductor 10. The conductor 10 and the plate 8 are connected respectively to the two poles of a DC source 12.

The device illustrated by FIG. 1 also includes a light generator 13 capable of emitting a sequence of very short light pulses of about 30 picoseconds duration each. The generator 13 may be constituted for example by a neodymium-doped yttrium aluminium garnet operating with a mode-locking dye cell.

The time intervals between two successive light pulses emitted by the generator 13 can be set to lie between a hundred or so picoseconds and a few nanoseconds in accordance with a program which is predetermined by means of an optical system 14 of known type, constituted, for example, by two opposite reflectors on whose surfaces the light beam emitted by the generator 13 is reflected several times in succession. The time intervals between the light pulses depend on the mutual disposition of the two reflectors. One of the reflectors of the system is semi-transparent and the light pulses which pass through this reflector are concentrated on the part 11 by means of a lens 15.

The device shown in FIG. 1 operates as follows:

Before being illuminated by the light pulses emitted by the generator 13, the part 11 has high electric resistance so that in practice the plate 7 is electrically insulated from the conductor 10. As the light pulses are received, the resistance of the part 11 is reduced by creating charge carriers. The reduced resistance of the part 11 remains constant between two consecutive light pulses, since the time interval between two consecutive pulses is very much shorter than the lifetime of the charge carriers.

The capacitor formed by the plates 7 and 8 and by the plate 9 is therefore charged in successive steps by the source 12 during the illumination of the part 11 by the sequence of light pulses.

If the number of steps (and consequently the number of light pulses of the sequence) is sufficiently high, the rising edge of the electric pulse which constitutes the charging curve of the capacitor can be assimilated to a continuous rise.

The shape of this rising slope can be made identical to a predetermined model by adjusting the time interval which separates the successive light pulses.

Figure 2:
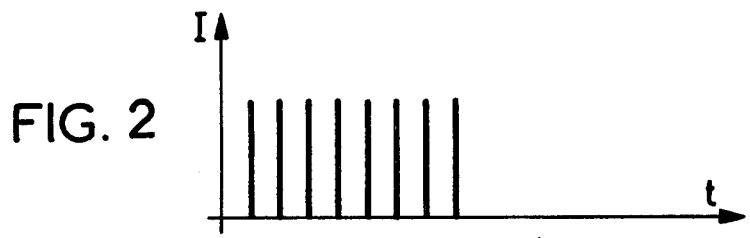
FIG. 2 is a diagram which shows a sequence of laser pulses emitted by a generator which forms a part of the device shown in FIG. 2
Figure 3:
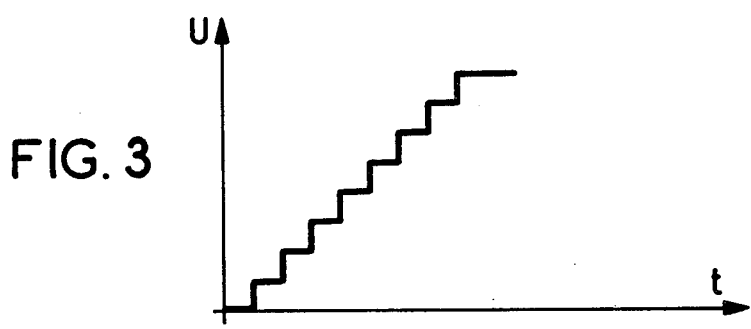
FIG. 3 is a diagram showing the waveform of the electric pulse generated from the laser pulses shown in FIG. 2.

FIGS. 2 and 3 show that a linear slope can be obtained from a sequence of light pulses of the same intensity which are spaced apart regularly. FIG. 2 shows schematically the waveform of the intensity I of these pulses as a function of time t and FIG. 3 shows the corresponding potential difference U between the plates 7 and 8 as a function of time t, the time scales being identical.

Figure 4:
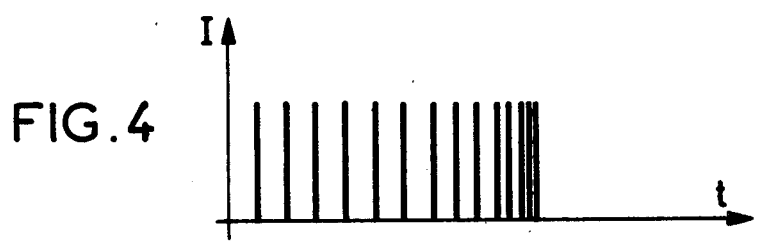
FIG. 4 is a diagram showing another sequence of laser pulses emitted by said generator.
Figure 5:
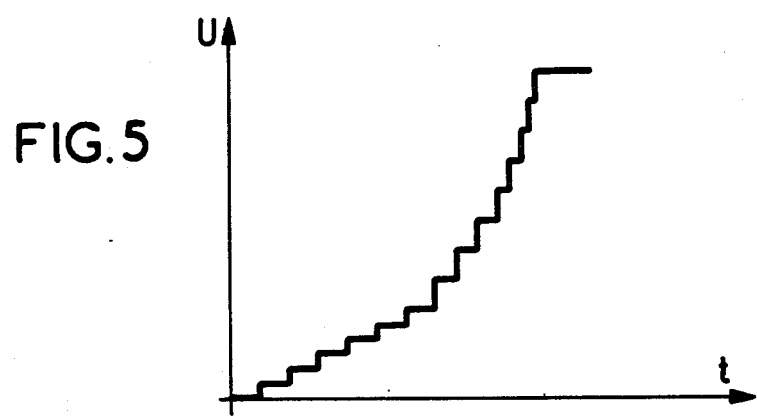
FIG. 5 is a diagram showing the waveform of the electric pulse generated from the laser pulses shown in FIG. 4.

Bringing two successive pulses of the pulse sequence closer together as shown in FIG. 4 produces a rising slope whose gradient increases as a function of time (see FIG. 5).

Generally, a variation in one direction of the length of the intervals of time between the light pulses causes a variation in the opposite direction of the instantaneous gradient of the rising slope.

It is clear that such a variation in slope can also be obtained by adjusting the intensity of the light pulses during the illumination of the part 11, in accordance with a predetermined model. The intensity can be adjusted by means of the optical system 14 described hereinabove by placing suitable attenuators on the path of the light beam between the two opposite reflectors of this system.

To form the falling slope of the electric pulse collected between the plates 7 and 8, the electric potentials of these plates need only be equalized.

Figure 6:
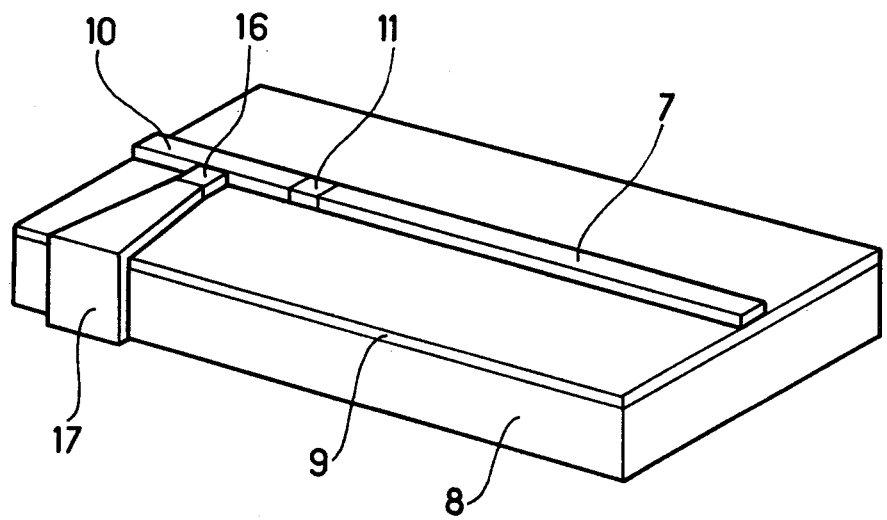
FIG. 6 is a perspective view of a component of the device shown in FIG. 1.

The electric potentials can be equalized by means of another semiconductor part 16 made, for example, of silicon, in contact with the conductor 10 and electrically connected to the plate 8 by a connection part 17, as shown in FIG. 6, which is a perspective view of the electric switching unit of the device shown in FIG. 1, the same references designating the same parts.

If, as is generally the case, it is required to obtain a virtually vertical falling slope, the part 16 must be illuminated, after the part 11 has been illuminated, by another light pulse which is very intense and which can be delivered by the generator 13 or by another laser generator, (not shown). Thus, a short-circuit is formed between the plates 7 and 8.

Of course, it is also possible, if required, to obtain a progressive falling slope in accordance with a predetermined model by illuminating the part 16 with another sequence of light pulses analogous to that used for the rising slope.

The electric pulse of predetermined form which is generated across the plates 7 and 8 can be used, as shown in FIG. 1, to supply the electrodes 5 and 6 of the electro-optical cell disposed on the path of the laser pulses 2 which are emitted by the generator 1 and which are linearly polarized by the polarizer 3. In this case, the pulses emitted by the generator 13 are synchronized with those emitted by the generator 1, so that the electric pulse reaches the electrodes of the cell at a time when the laser pulse is passing through the cell. The polarizer is directed so that the laser pulse which comes from the generator 1 will be transmitted by the cell only during the short instant when the electrodes 5 and 6 receive the electric pulse. Thus, it is possible to obtain a laser pulse whose duration is very short, for example 1.5 nanoseconds and whose waveform corresponds to that of the electric pulse and which can consequently be made identical to a predetermined shape.

Of course, the invention is in no way limited to the embodiments which have been described and illustrated only by way of example. In particular, without going beyond the scope of the invention, some means can be replaced by equivalent means. Thus, the electric switch and the electro-optical cell can constitute a single flat transmission line and the DC source which supplies the switch can be a coaxial line which transmits a DC gating pulse.

I claim:

1. A method of generating an electric pulse of predetermined waveform, said method comprising the steps of:
    providing a capacitor having first and second plates, the first plate being connected to a conductor by a portion of semiconductor material which is rendered conductive by the application of light thereto,
    connecting said conductor and the second plate of the capacitor to respective poles of a DC source;
    illuminating said semiconductor material with a sequence of light pulses of intensity sufficient to enable an electric charge to accumulate on the capacitor at each pulse thereby causing the capacitor to charge following a staircase charging curve;
    adjusting the duration of the intervals of time which separate two successive light pulses in accordance with a predetermined program, so that the average of the staircase charging curve of the capacitor has a waveform which approximates the rising portion of the predetermined waveform; a variation in one direction of the duration of an interval of time causing a variation in the opposite direction of the instantaneous gradient of the curve; and
    after illumination, equalizing the potentials of the plates so as to discharge the capacitor along a curve whose form is substantially identical to that of the falling portion of the predetermined waveform.

2. A method according to claim 1, further comprising the step of adjusting the intensity of the various light pulses in accordance with another predetermined program.

3. A method according to claim 1, wherein the falling slope of the predetermined waveform is substantially vertical, and the potentials of the plates are equalized by lighting another portion of semiconductor material with another light pulse, this other portion being in electric contact with the first and second plates, and the light pulse being of sufficient intensity for said other portion of semiconductor material to short the plates together for a substantially instantaneous discharge of the capacitor.

4. A method according to claim 1, wherein the potentials are equalized by lighting with a sequence of light pulses another portion of semiconductor material which is in electric contact with the first and second plates.

5. A method according to claim 1, wherein said light pulses are emitted by a laser generator.

6. A method according to claim 1, wherein said semiconductor material is silicon.

7. A method according to claim 5, wherein an electro-optical crystal of an electro-optical cell is disposed on the path of the laser pulse from which a portion is to be cut out, and the two electrodes of the electro-optical cell are connected respectively to the two plates of the capacitor, and wherein the light pulses are delivered to the capacitor while the laser pulse is passing through the electro-optical cell.

8. A method according to claim 7, further comprising the step of linearly polarizing the laser pulse from which a portion is to be cut out.

* * * * *